United States Patent
Huang et al.

(10) Patent No.: US 7,446,056 B2
(45) Date of Patent: Nov. 4, 2008

(54) METHOD FOR INCREASING POLYSILICON GRAIN SIZE

(75) Inventors: Yao-Hui Huang, Hsinchu (TW); Tung-Li Lee, Jhubei (TW); Chih-Hao Lin, Hsinchu (TW); Yen-Fei Lin, Donggang Township, Pingtung County (TW); James Sun, Taipei (TW); Chen Pu-Fang, Hsinchu (TW); David Huang, Lujhou (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 11/293,709

(22) Filed: Dec. 1, 2005

(65) Prior Publication Data

US 2006/0134926 A1 Jun. 22, 2006

Related U.S. Application Data

(63) Continuation-in-part of application No. 10/431,120, filed on May 7, 2003, now abandoned.

(51) Int. Cl.
*H01L 21/44* (2006.01)
*H01L 21/31* (2006.01)
*H01L 21/469* (2006.01)

(52) U.S. Cl. .............. 438/778; 438/775; 438/758; 438/648

(58) Field of Classification Search .............. 438/778, 438/775, 482, 486, 488, 648, 711, 764, 756
See application file for complete search history.

(56) References Cited

U.S. PATENT DOCUMENTS 5,242,855 A * 9/1993 Oguro .................. 438/660

(Continued)

OTHER PUBLICATIONS

Ted Kamins, "Deposition And Characteristics Of Polysilicon Films For Integrated-Circuit Applications", Mat. Res. Co. Symp. Proc. vol. 106, 1988 Materials Research Society, pp. 3 through 14.

Thomas A. Carbone et al., "Correlation of Ellipsometric Volume Fraction to Polysilicon Grain Size from Transmission Electron Microscopy", 1999 IEEE/SEMI Advanced Semiconductor Manufacturing Conference, pp. 359 through 367.

*Primary Examiner*—Chuong A. Luu
(74) *Attorney, Agent, or Firm*—Duane Morris LLP

(57) ABSTRACT

The present invention relates to a method for increasing the grain size of a polysilicon layer, which includes exposing a silicon oxide wafer in a deposition chamber to an amount, effective for the purpose, of nitrogen at a flow rate of at least about 240 standard liters per minute (slm). The instant invention further relates to a method for inhibiting the formation of a polysilicon seed in a furnace, which includes the treatment as noted above. The invention also relates to a method for forming a polysilicon layer, including: forming a silicon oxide layer on a substrate, the silicon oxide layer having a plurality of oxygen molecules therein; exposing the silicon oxide layer to a predetermined amount of nitrogen-containing gas in a furnace, whereby a plurality of nitrogen molecules in the nitrogen-containing gas replaces at least part of the oxygen molecules in the silicon oxide layer; and forming a polysilicon layer on the silicon oxide layer.

4 Claims, 3 Drawing Sheets

U.S. PATENT DOCUMENTS

| | | | | |
|---|---|---|---|---|
| 5,525,555 A * | 6/1996 | Zank | | 501/87 |
| 5,804,473 A * | 9/1998 | Takizawa | | 438/166 |
| 6,287,988 B1 * | 9/2001 | Nagamine et al. | | 438/770 |
| 6,514,879 B2 * | 2/2003 | Arghavani et al. | | 438/773 |
| 6,803,330 B2 * | 10/2004 | Ramkumar et al. | | 438/783 |
| 6,812,081 B2 * | 11/2004 | Yamazaki et al. | | 438/197 |
| 2002/0073925 A1 * | 6/2002 | Noble et al. | | 118/723 ME |
| 2003/0049372 A1 * | 3/2003 | Cook et al. | | 427/248.1 |

* cited by examiner

METHOD FOR INCREASING POLYSILICON GRAIN SIZE

CROSS-REFERENCE TO RELATED APPLICATION

This application is a continuation-in-part of application Ser. No. 10/431,120, filed May 7, 2003 now abandoned.

FIELD OF THE INVENTION

The present invention relates generally to semiconductor device manufacturing, and, more particularly, to a method for controlling device speed by adjusting polysilicon grain size.

BACKGROUND OF THE INVENTION

In the manufacture of semiconductor devices, wafers, such as silicon wafers, are subjected to a number of processing steps. The processing steps include depositing or forming layers, patterning the layers, and removing portions of the layers to define features on the wafer. One such process used to form the layers is a procedure known as chemical vapor deposition (CVD), where reactive gases are introduced into a vessel containing the semiconductor wafers. The reactive gases facilitate a chemical reaction that causes a layer to form on the wafers.

One deposition process involves the formation of polycrystalline silicon (polysilicon) layers on the wafer by decomposing $SiH_4$ molecules to Si atoms, which in turn combine to form Si grains, or "polysilicon." There are numerous factors that affect the deposition rate and deposition polysilicon film characteristics of a deposition tool. These factors include, e.g., the flow rate of reactive gases through the chamber and the temperature/pressure of the chamber.

Polysilicon furnaces both within and without a nitrogen box (the furnace wafer loading area immediately below the furnace main body) may play an important role in controlling polysilicon grain size, thereby governing device speed. An important consideration is the actual $N_2$ (nitrogen) flow which continuously treats the silicon wafer surface in the $N_2$ box. A continual need exists for effective mechanisms for increasing the grain size of a silicon wafer.

The structure of films and the electrical behavior of devices incorporating the polysilicon layers are influenced by deposition conditions. Also, diffusion in polysilicon layers is influenced by grain boundaries. The grain boundaries are affected by e.g., the deposition temperature, pressure, and gas that individually influence the Si-seed number at the seed layer. The more seeds that exist, the smaller the growth of grain size, and the more grain boundaries are formed. By the method of the present invention, the oxygen molecules, which will be interfered by $N_2$ flow in the $N_2$ box, adsorb on the oxide surface before "boat up" influences the poly seed number, and thus the grain size.

SUMMARY OF THE INVENTION

The present invention relates to a method for increasing the grain size of a polysilicon layer in a furnace, which includes exposing a silicon oxide wafer in a deposition chamber to an amount, effective for the purpose, of nitrogen at a flow rate of at least about 240 standard liters per minute (slm). The instant invention further relates to a method for inhibiting the formation of a polysilicon seed in a furnace, which comprises the treatment as noted above, namely exposing a silicon oxide wafer in a deposition chamber to an amount, effective for the purpose, of nitrogen at a flow rate of at least about 240 slm.

The invention also relates to a method for forming a polysilicon layer, comprising: forming a silicon oxide layer on a substrate, said silicon oxide layer having a plurality of oxygen molecules therein; exposing said silicon oxide layer to a predetermined amount of nitrogen-containing gas in a furnace, whereby a plurality of nitrogen molecules in said nitrogen-containing gas replaces at least part of the oxygen molecules in said silicon oxide layer; and forming a polysilicon layer on said silicon oxide layer, wherein the flow rate of nitrogen-containing gas is at least about 240 slm.

BRIEF DESCRIPTION OF THE DRAWINGS

The present invention may be understood by reference to the following description taken in conjunction with the accompanying drawings, in which.

DESCRIPTION OF THE PREFERRED EMBODIMENTS

Figure 1:
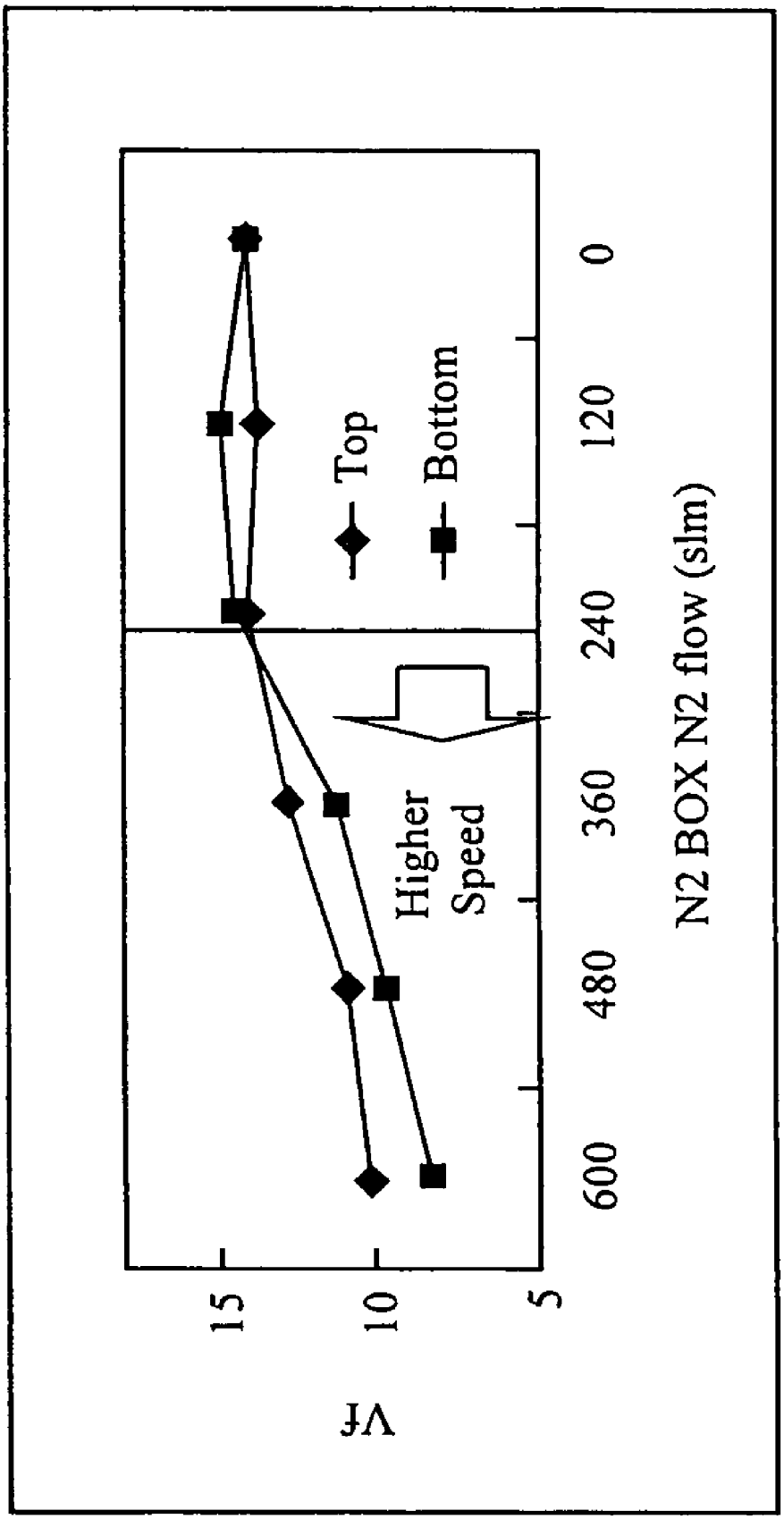
FIG. 1 is a graph of the effect of increased nitrogen flow in a furnace.

According to the method of the present invention, a maximizing of polysilicon grain size results in an increase in device speed. In the method of the present invention, when an oxide wafer (i.e., a surface capped with a thin $O_2$ boundary layer) was placed in an $N_2$ box, the wafer was exposed to bulk $N_2$ flow, with absorbed $O_2$ being removed as a result. Upon treatment with the $N_2$ flow, absorbed oxygen bonded with oxide molecules, and the oxygen depletion site was filled with $N_2$ molecules. Nitrogen molecules "interfere" with silicon in forming a polysilicon seed; therefore, fewer seeds and a larger grain size was the result.

A prototypical furnace includes four tube furnaces, which are used for curing polymers, sintering, and growing oxides and nitrides on silicon wafers. There are also four gas flow timers for the furnace. The orientation of the timers matches the orientation of the tubes with which they correspond; with a maximum time of twelve hours, the flow timers are used to control the time the gas flows in the furnaces. The minimum amount of time for the process to function correctly is about two hours. When the timer reaches zero, the gas discontinues to flow.

There are three flow meters located just below the gas flow timers. Beneath each of the flow meters are two flow meter valves. The cut-off valves are the valves closest to the flow meters. The handles are at a 90° angle when the flow meters are closed. When the handles are parallel with the flow meter, they are open. The lower valves are the needle valves, which control the gas flow into the flow meters. To the right of the flow meters is the three-way valve. This valve controls which gas flows into the middle flow meter (tube 2). The two selectable gases are oxygen and nitrogen. The narrow, pointed end of the handle points to the gas that is being used. When tube 2 is not in use, the valve is turned to the off position. When furnace tube 2 is used, which performs oxidation, the oxygen cylinder in the chase behind the furnace is on. Note that in order to check that the gas pressure is sufficient, the cylinder gauge closest to the cylinder is read. The gauge to the left indicates the gas line pressure; it is set to approximately 25 psi.

The furnace temperature is controlled by a programmable temperature control unit. There is one control for every furnace; there are programmable temperature controllers on each of the temperature control units. These controllers monitor each of the furnace zone heaters, and allow the programming of several process steps. Thus, in order to operate the furnaces, the following steps are performed: (1) set the appropriate atmosphere; (2) load the furnace; (3) set the temperature program; (4) run the process; (5) end the run.

The first step in setting the atmosphere is to set the gas flow timer to the length of the particular run. This prevents the waste of gas in the system. The next step is to set the flow of gas using the flow meters.

The first step in loading the furnace is to place a sample into a quartz boat, which is found in the nitrogen box next to the furnace. The cap on the end of the tube is removed, and the boat placed just inside the opening. A metal rod is used in order to carefully push the boat to the middle of the furnace tube. The desired temperature in degrees Celsius is set for the controllers, and the temperature cooled to about room temperature when the program is done. In order to remove the boat from the furnace, the loading procedure is reversed.

Figure 2:
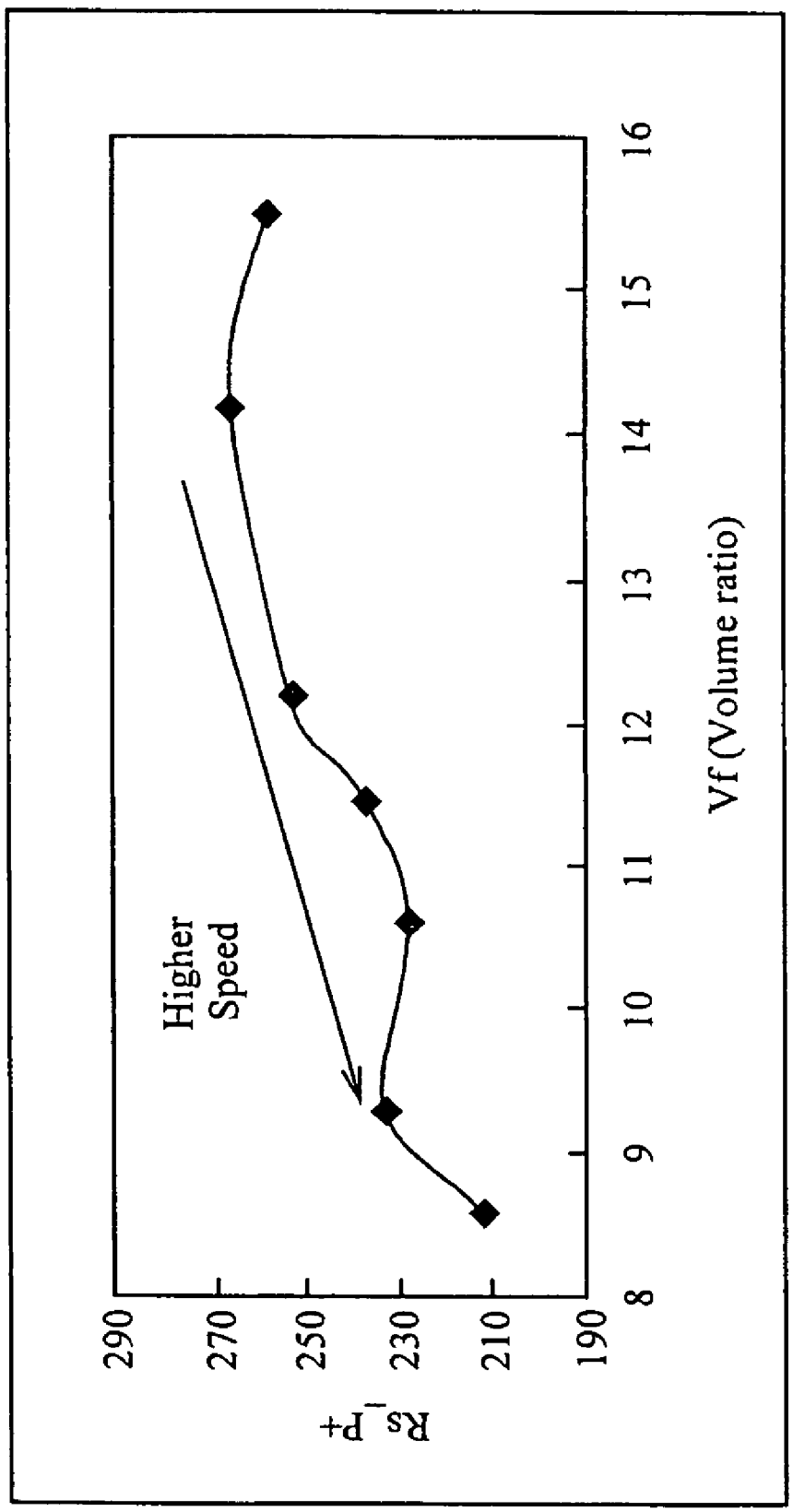
FIG. 2 is a graph of polysilicon film volume fraction versus control wafer resistivity in a furnace.
Figure 3:
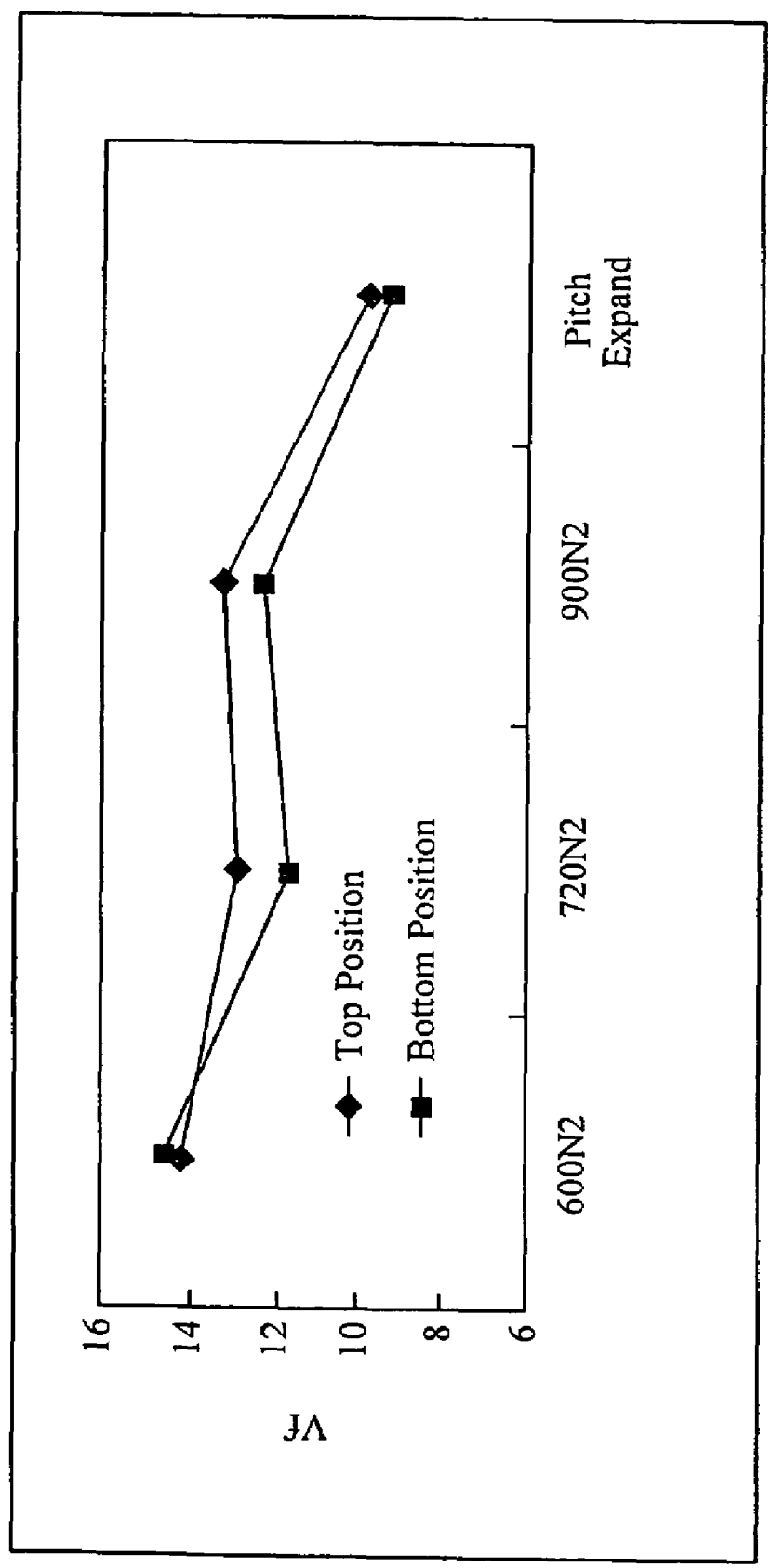
FIG. 3 is an additional graph of the effect of increased nitrogen flow in a furnace.

In the testing of the present invention, an analysis of the effect of an increase in nitrogen flow, via nitrogen shower or other acceptable method was conducted in a furnace. As shown in FIG. 1, the $V_f$ (the polysilicon film volume fraction, which is an index of polysilicon grain size) trends down (i.e., larger grain size, as nitrogen flow increased). In FIG. 2, note that $R_s$ (control wafer resistivity) trends down (i.e., higher speed) as $V_f$ trends down (i.e., a larger grain size).

Furthermore, it should be noted that an $N_2$ flow of 240 slm is a critical level; indeed, as demonstrated in FIG. 1. $V_r$ trends markedly down at flow levels greater than 240 slm. Note also that $V_r$ readings markedly increase at levels of e.g., 600 down to 240 slm, and are relatively constant at levels below 240 slm, with smaller $N_2$ flow inducing more seeds and resulting in smaller grain sizes. Therefore, it is apparent that device speed is significantly enhanced by the amount of the $N_2$ flow rate in a furnace, with the 240 slm level as an important delineating factor.

Although not seeking to be bound by any theory, the following description of the mechanism of the present invention is provided: It is known that $O_2$ has more affinity with Si, as compared to $N_2$. When an oxide wafer (surface capped with thin oxygen boundary layer) is placed in an $N_2$ box, it is exposed to bulk $N_2$ flow, and some adsorbed oxygen will be blown out. At the follow-up thermal/$N_2$ flow treatment, the adsorbed oxygen will bond with oxide, and oxygen depletion sites will be filled with $N_2$ molecules. Nitrogen molecules will interfere with Si in forming a polysilicon seed, resulting in fewer seeds and a larger grain size.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

What is claimed is:

1. A method for forming a polysilicon layer, which comprises: forming a silicon oxide layer on a substrate, said silicon oxide layer having a plurality of oxygen molecules therein; exposing said silicon oxide layer to a predetermined amount of nitrogen-containing gas in a furnace, whereby a plurality of nitrogen molecules in said nitrogen-containing gas replaces at least part of the oxygen molecules in said silicon oxide layer; and forming a polysilicon layer on said silicon oxide layer, wherein the flow rate of nitrogen-containing gas is about 600 down to 240 standard liters per minute, and the flow of nitrogen is achieved through nitrogen shower.

2. The method as recited in claim 1, wherein the nitrogen molecules inhibit polysilicon seed formation in the furnace.

3. The method as recited in claim 2, wherein a reduction in polysilicon seed formation results in an increase of polysilicon layer grain size.

4. The method as recited in claim 3, wherein the increase of grain size results in an increase in semiconductor device speed.

* * * * *